United States Patent [19]

Jackson et al.

[11] Patent Number: 5,081,513
[45] Date of Patent: Jan. 14, 1992

[54] ELECTRONIC DEVICE WITH RECOVERY LAYER PROXIMATE TO ACTIVE LAYER

[75] Inventors: Warren B. Jackson, San Francisco; Michael Hack, Mountain View, both of Calif.

[73] Assignee: Xerox Corporation, Stamford, Conn.

[21] Appl. No.: 662,682

[22] Filed: Feb. 28, 1991

[51] Int. Cl.[5] ............... H01L 45/00; H01L 27/12; H01L 29/78; H01L 29/04
[52] U.S. Cl. ............... 357/23.7; 357/4; 357/2; 357/23.14; 357/59; 357/15; 357/30
[58] Field of Search ............ 357/23.7, 4, 2, 30 K, 357/23.14, 59 B, 15

[56] References Cited

U.S. PATENT DOCUMENTS

| | | |
|---|---|---|
| 4,674,763 | 6/1987 | Ovshinsky et al. ............... 357/4 |
| 4,686,553 | 8/1987 | Possin ............... 357/23.7 |
| 4,829,358 | 5/1989 | Yamazaki ............... 357/41 |

FOREIGN PATENT DOCUMENTS

| | | |
|---|---|---|
| 0145403 | 6/1985 | European Pat. Off. . |
| 0166261 | 1/1986 | European Pat. Off. . |
| 60-66864 | 4/1985 | Japan . |
| 61-48977 | 3/1986 | Japan . |
| 0219665 | 9/1987 | Japan . |
| 0119576 | 5/1988 | Japan . |

OTHER PUBLICATIONS

"Thermally Induced Metastability in Amorphous Silicon Thin-Film Transistors", Lee et al., Applied Physics Letters, vol. 53, No. 26, Dec. 26, 1988, pp. 2617-2619.
Threshold Voltage Control of an A-Si TFT, Oki et al., pp. 186-189, Conference Record of the International Topical Conference on Hydrogenated Amorphous Silicon Devices and Technology, Nov. 21-23, 1988.
Threshold Voltage Shift of Amorphous Silicon Thin-Film Transistors by Step Doping, Matsumoto et al., pp. 606-607, Appl. Phys. Lett 54(7), Feb. 13, 1989.
Proximity Recovery Layers to Speed Up the Recovery of Stressed Amorphous Silicon Thin-Film Transistors, Hack et al., pp. 355-360, Mat. Res. Soc. Symp. Proc., vol. 192, Symposium Held, Apr. 17-20, 1990.

Primary Examiner—Rolf Hille
Assistant Examiner—Wael Fahmy
Attorney, Agent, or Firm—Serge Abend

[57] ABSTRACT

An electronic device including a substantially intrinsic non-single crystal semiconductor active layer having a number of metastable defects therein, the active layer being responsive to the application of stress upon the device by shifting its Fermi level from an equilibrium state within its mobility gap and the spontaneous creation of a surplus number of metastable defects in the mobility gap located in opposition to the shift in the Fermi level, and a recovery layer comprising a doped non-single crystal semiconductor layer positioned in proximity to the active layer and responsive to the application of stress upon the device by changing the number of active dopant atoms therein and thereby changing the charge in the recovery layer, for allowing the excess charge to spill over to the active layer for accelerating the return of the active layer to its equilibrium state.

53 Claims, 5 Drawing Sheets

ELECTRONIC DEVICE WITH RECOVERY LAYER PROXIMATE TO ACTIVE LAYER

FIELD OF THE INVENTION

This invention relates to non-single crystal semiconductor devices having increased stability. The equilibrium state of non-single crystal semiconductor devices is altered when external stresses act upon the device and shift its Fermi level, in response to which the number of defects therein is increased. A doped recovery layer located proximate to the device active layer provides charge of the appropriate sign to accelerate the recovery action by accelerating the removal of stress created defects.

BACKGROUND OF THE INVENTION

Amorphous silicon thin film transistors (TFTs) are now widely used in many large area electronic applications, such as displays, printers, scanners and electronic copiers. However, the electronic characteristics of these devices tend to change slowly with time, depending on stress conditions and temperature. This process occurs because the external stresses shift the Fermi level from its equilibrium (midgap) position and in response to changes in Fermi level position a-Si:H creates defects which oppose the shift of the Fermi level in an attempt to restore the Fermi level back to the midgap, i.e. the most stable thermodynamic state. This process is known as equilibration.

In conventional usage, the equilibration effect causes a threshold voltage shift in standard a-Si:H transistors when these devices are stressed by the application of a gate electrode potential causing electrons or holes to accumulate within the channel. Equilibration also causes an output characteristic shift in high voltage a-Si:H transistors when these devices are stressed in their OFF condition. Both of these shifts are the result of increased numbers of defects in the active a-Si:H layer after the Fermi level has returned to the midgap position once the applied stress is removed. Over time these extra defects will anneal away at a rate determined by temperature and the Fermi level position.

In FIG. 1 there is shown a standard amorphous silicon thin film transistor 10 in the ON linear condition. Transistor 10 comprises a gate electrode 12, a gate dielectric layer 14, an active charge transport layer 16, source and drain electrodes 18 and 19, and passivation layer 20. When the transistor 10 is turned ON by applying a positive bias to the gate electrode 12, free electrons flow from the source electrode 18 to the drain electrode 19 through the active charge transport layer 16 to form an accumulation channel 21 therein near the interface with the gate dielectric 14. During accumulation the channel 21 becomes more conductive as its Fermi level shifts from midgap toward the conduction band. Because this is not in a stable state, i.e. there are more free and trapped electrons in the active layer 16 than in its equilibrium state, the amorphous semiconductor material equilibrates by generating more defects in the bottom half of the bandgap in an attempt to return the Fermi level to midgap. Then, upon removal of the gate bias (when the transistor is turned OFF), the accumulation channel is eliminated and there is no longer an excess of electrons. However, there will be an excess of defects which will slowly self anneal away.

The above described changes, in response to the electrostatic stressing of the standard amorphous silicon thin film transistor during its normal, intended use, cause a threshold voltage ($V_{TH}$) shift, as may be seen in shifting $(\log)I_{DS}$ vs. $V_G$ curves illustrated in FIG. 2. The original transistor characteristics are represented by curve A of FIG. 2. During its ON state, as defects are created to oppose the Fermi level shift, the characteristics may shift to curve B because free electrons, having fallen into the traps, no longer contribute to the current and more charge must be induced into the channel by a higher gate bias in order for the same current to flow. When the gate bias is removed, the charge transport layer again corrects itself by slowly annealing away some of the defects, returning to the characteristics of curve C, and only returning extremely slowly to its original position, A. Thus, a threshold voltage shift, i.e. the difference in gate voltages at which the device will turn ON ($V_{TH}=V_C-V_A$), will occur during each cycle. While this shift may not be large for any single ON-OFF cycle; over the lifetime of the device, there is a net drift which may cause the device to exhibit a threshold shift of several volts. To compensate for this undesirable shift, it is possible to overdrive the gate by a margin of several volts.

In FIG. 3 there is shown a known high voltage amorphous silicon thin film transistor 22. The transistor 22 comprises a gate electrode 24, a gate dielectric layer 26, an active charge transport layer 28, a source electrode 30, a drain electrode 32, and a passivation layer 33. A channel in the active layer includes a gated portion $L_1$ and an ungated, or "drift" portion $L_2$. As with the low voltage transistor, this device will exhibit a threshold voltage shift due to the effect of the gate bias on the gated portion $L_1$. Additionally, in the OFF condition of the device, the high drain potential acting on the "drift" portion $L_2$ sweeps electrons out of that region, with the greatest depletion occuring in that portion of the dead region adjacent to the end of the gate electrode 24. This deep depletion of electrons moves the Fermi level downward toward the valence band, in response to which the amorphous semiconductor material equilibrates by generating more defects in the top half of the bandgap in an attempt to return the Fermi level to midgap. Then, when the transistor is turned ON and this deep depletion is removed, there will be an excess of defects in the top half of the bandgap which oppose the drain potential and requires a higher drain potential to be applied in order for the same amount of current to flow. The excess defects will slowly self anneal away.

The above described changes, in response to the electrostatic stressing of the known high voltage amorphous silicon thin film transistor during its normal, intended use, cause a "$V_x$ shift," as may be seen in the $I_{DS}$ vs. $V_{DS}$ curves illustrated in FIG. 4. We define the term "$V_x$ shift" as the difference between the x-axis crossings of the tangents to the inflection point of the several $I_{DS}$ vs. $V_{DS}$ curves. The original transistor characteristics are represented by curve E. During the OFF state, when the "drift" region is depleted and defects are generated, the characteristic curve will shift to curve F. This phenomenon is fully described in a copending application, assigned to the same assignee as the present application, entitled "High Voltage Thin Film Transistor With Second Control Electrode" (Hack et al), U.S. Pat. No. 4,984,041, granted Jan. 8, 1991. When the device is ON or is at rest, the active layer again corrects itself by self annealing away some of the excess defects, but as this is a slow process at room temperature it will only return to characteristic curve G. Although it is often possible to work around these shifting characteristics without adverse effects, it would be highly desirable for the device to return to its original characteristics as fast as possible.

Other non-crystalline semiconductor active devices also will exhibit the same or similar response to external perturbations such as electrical bias, elevated temperature and intense illumination. Therefore, it is an object of this invention to provide an electronic device which is highly stable and will exhibit very small, if any, shifts in its characteristics in response to external perturbations.

It is a further object of this invention to accelerate the restoration of the active layer of an electronic device to its original state after changes have occured therein response to external perturbations.

SUMMARY OF THE INVENTION

The present invention may be carried out, in one form, by providing an electronic device including a substantially intrinsic non-single crystal semiconductor active layer having a number of metastable defects therein, the active layer being responsive to the application of stress upon the device by shifting its Fermi level from an equilibrium state within its mobility gap and the spontaneous creation of a surplus number of metastable defects in the mobility gap located in opposition to the shift in the Fermi level. Upon removal of the stress, the active layer has an abundance of metastable defects. A doped non-single crystal semiconductor recovery layer is positioned in proximity to the active layer so that the recovery layer is responsive to the application of stress upon the device by changing the number of active dopant atoms therein and thereby changing the charge in the recovery layer, for allowing the excess charge to be exchanged by the recovery layer with the active layer for accelerating the return of the active layer to its equilibrium state.

BRIEF DESCRIPTION OF THE DRAWINGS

Other objects and further features and advantages of this invention will be apparent from the following, more particular, description considered together with the accompanying drawings, wherein.

DETAILED DESCRIPTION OF THE INVENTION

We have developed an improvement in non-crystalline semiconductor devices. In particular, the improved low voltage and high voltage thin film transistor forms of this invention will exhibit accelerated recovery from their respective threshold voltage and $V_x$ shifts.

Figure 5:
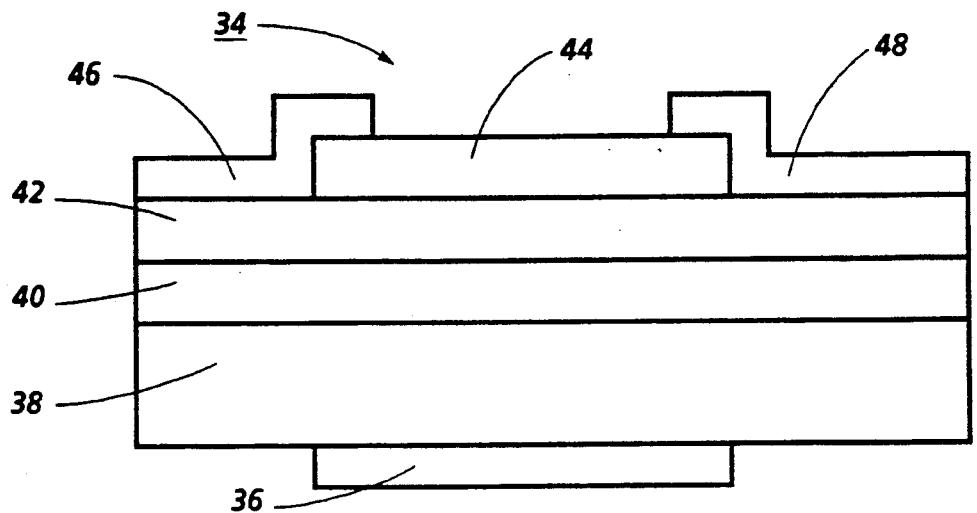

Turning again to the drawings there is illustrated in FIG. 5 one form of a standard thin film transistor structure 34 modified in accordance with the present invention. It comprises a substrate (not shown) which may be a sheet of glass or other material which is readily available in large area format and is compatible with the device fabrication temperatures, on the order of 250° C. A patterned conductive gate electrode 36, which may be made of chromium, is deposited upon the substrate, and a gate dielectric layer 38, which may be made of silicon nitride, overlies the gate electrode. A substantially intrinsic a-Si:H active charge transport layer 40 is deposited upon the gate dielectric layer and a lightly doped proximity recovery layer 42 is deposited upon the charge transport layer. A top nitride layer 44 deposited over layer 42 is patterned and etched to form vias for a deposited layer of phosphorus doped (n+) a-Si:H, which in turn is etched to form laterally spaced source electrode 46 and drain electrode 48. Chrome contacts overlying the n+ electrodes are not shown. The materials described above have been set forth only by way of example. We believe that the charge transport layer may also be made of GaAs and microcrystalline or polycrystalline forms of semiconductor materials. The proximity recovery layer 42 may be doped solely p-type or may be compensated, by which we mean including both p-type and n-type dopants. Dopant concentrations depend on the exact structure and application but values of from 3 to 100 parts per million boron or phosphorus are examples known to work for some implementations.

Figure 6:
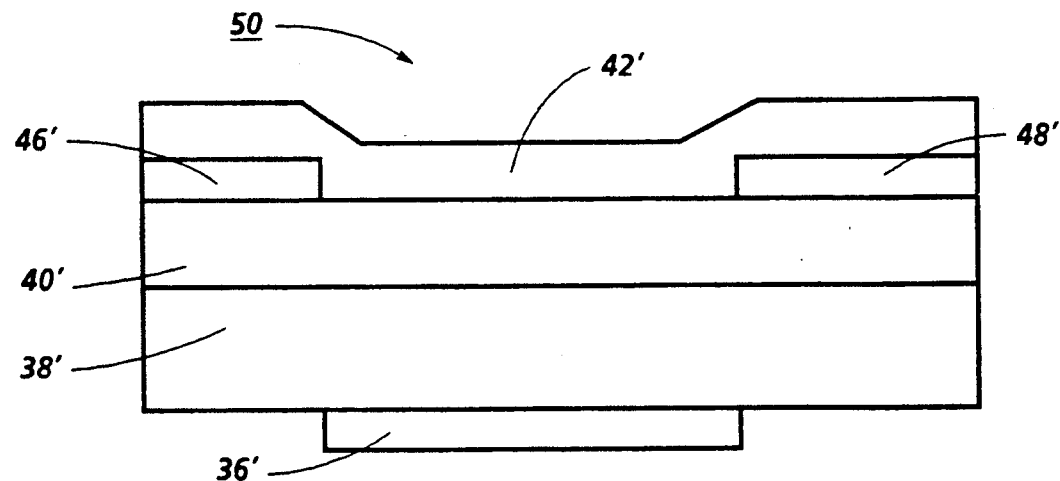

An alternate configuration of the standard thin film transistor incorporating our invention is illustrated in FIG. 6 and is identified by the numeral 50. Similar elements are identified by the same numerals with a prime (') attached. A gate electrode 36', a gate dielectric layer 38' and a charge transport layer 40' are deposited upon a substrate. An n+ semiconductor layer and a metal layer (not shown) are deposited, patterned and etched to form source and drain electrodes 46' and 48' and their overlying contacts, with a channel region therebetween. The lightly doped proximity recovery layer 42' is deposited over the entire device and would be etched away for making contact with the source and drain electrodes. This embodiment has the advantage that the proximity recovery layer 42' is adjacent to the stressed accumulation channel region of the charge transport layer 40' but is not interposed between the source and drain electrodes and the charge transport layer where it may introduce a detrimental series resistance.

Figure 7:
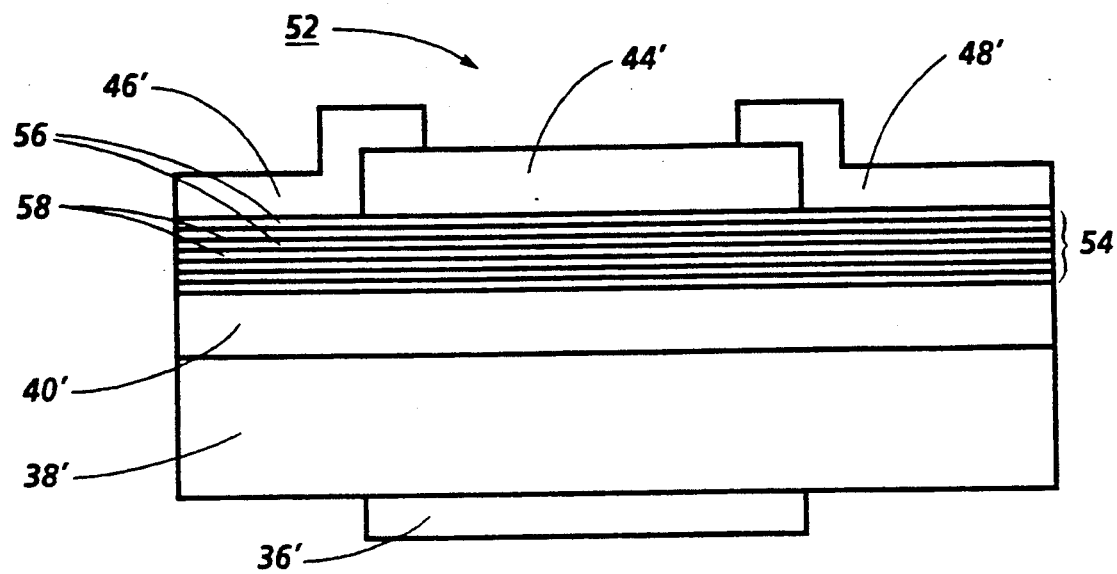
Figure 7A:
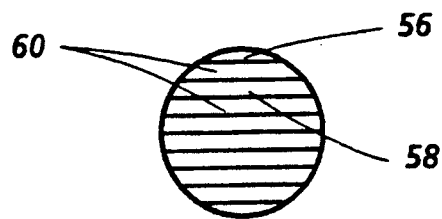

Yet another alternate configuration of the standard thin film transistor incorporating our invention is illustrated in FIG. 7 and is identified by the numeral 52. It differs from transistor 34 (shown in FIG. 5) in that the proximity recovery layer 54 comprises a superlattice of sequentially deposited alternating n-type layers 56 and p-type layers 58, resulting in an npnp structure, wherein each layer may be about 10 Å to 50 Å thick. It is also possible to separate the doped superlattice layers with intrinsic layers 60 to form an nipin structure (as shown in FIG. 7a). The superlattice structure has the benefit that it allows the proximity recovery layer to have the desired properties while maintaining the p-type and n-type dopant materials separate and allows unique tailoring of this layer. For example, while we believe that it is generally more desirable for there to be equal numbers of each of the dopant type layers, each having the same thickness and dopant concentration, so that the structure will be electrically neutral, it is easily possible to alter the relative amount of each dopant type in the superlattice structure in order to benefit a particular application. One of the n-type or p-type layers may be deposited thicker than the others, or the dopant concentration in one of the dopant type layers may be greater than the others. In other words, control over the properties of the aggregate structure may easily be achieved by deposition control of the sequentially deposited layers. A further advantage of the nipin superlattice is the ability to use dopant materials which may tend to chemically react together, perhaps adversely.

Figure 3:
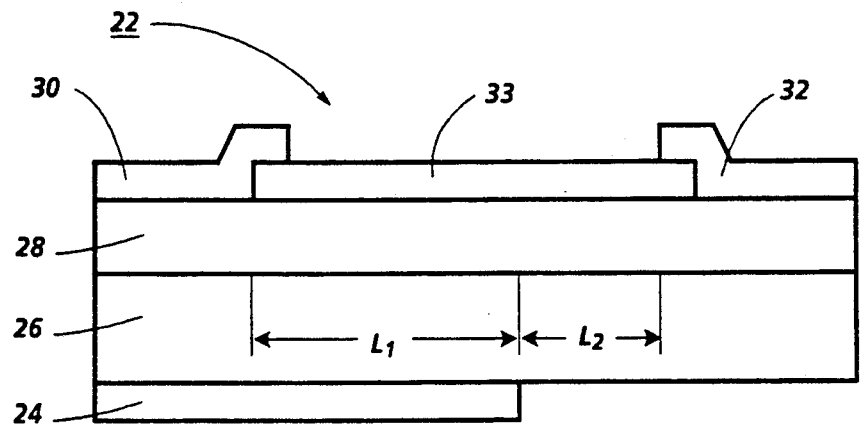
FIG. 3 illustrates a known a-Si:H high voltage thin film transistor.
Figure 8:
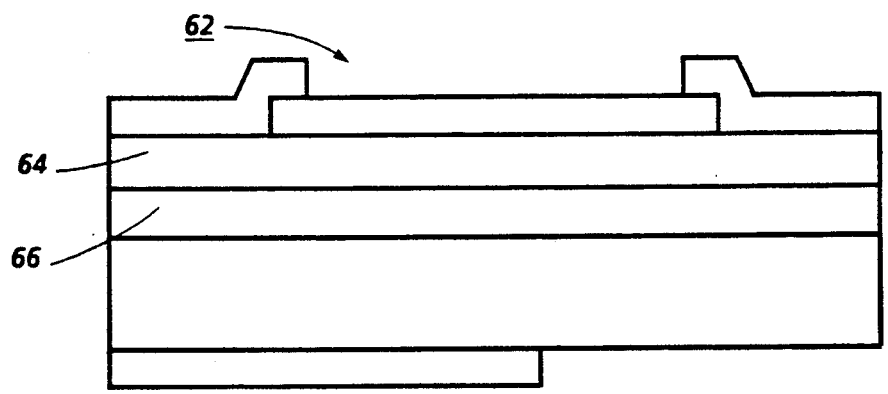
FIG. 8 illustrates a high voltage non-crystalline semiconductor thin film transistor constructed in accordance with the present invention.

A high voltage thin film transistor 62, incorporating the present invention is illustrated in FIG. 8. It is comparable to transistor 22, shown in FIG. 3 with the addition of a proximity recovery layer 64 deposited adjacent to the substantially intrinsic charge transport layer 66. The various modifications in the placement and structure of the recovery layer, illustrated and described relative to the low voltage thin film transistor, are equally applicable to the high voltage transistor. However, it should be compensated and not doped solely p-type.

Figure 9:
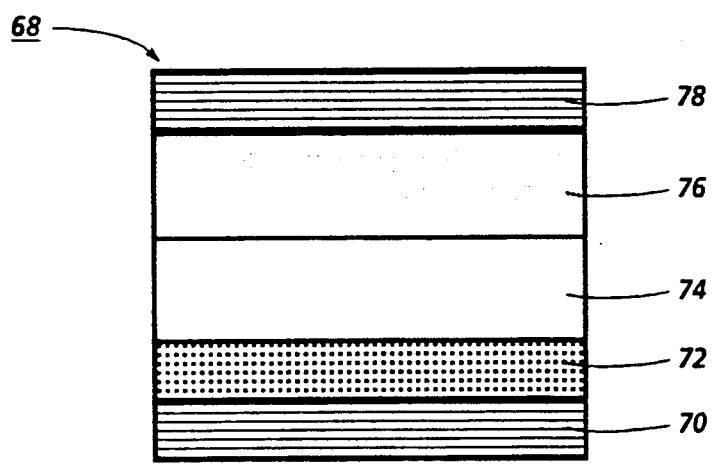
FIG. 9 illustrates a diode constructed in accordance with the present invention.
Figure 10:
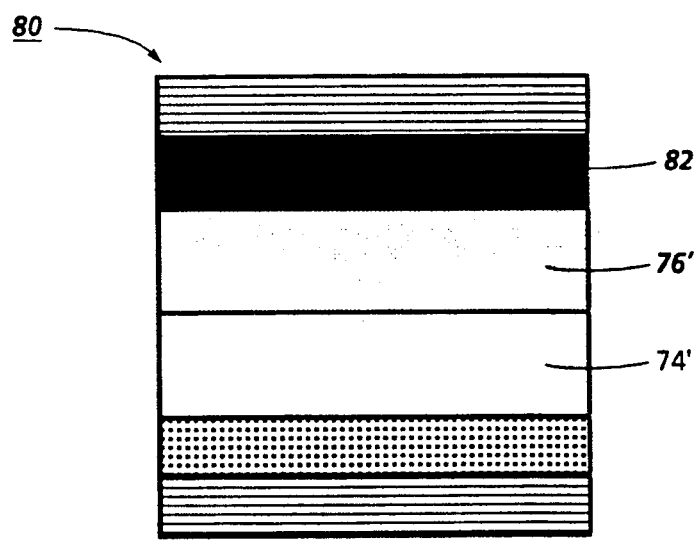
FIG. 10 illustrates a varactor constructed in accordance with the present invention.

In fact, any non-crystalline semiconductor electronic device whose characteristics shift in response to external perturbations, due to the equilibration effect may be returned rapidly to its normal condition by the addition of a proximity recovery layer which provides a source of appropriate charge. For example, the diode 68 of FIG. 9 comprises an ohmic back contact including a metal electrode 70, an n+ amorphous semiconductor layer 72, a proximity recovery layer 74, a substantially intrinsic amorphous semiconductor layer 76 and a collector electrode 78, which forms, together with the semiconductor layer 76, a Schottky barrier. Similarly, the varactor 80, shown in FIG. 10, comprises the same structure as the FIG. 9 diode with the addition of a dielectric layer 82 which prevents the passage of current. In each of these devices, the proximity recovery layer 74 may take any of the forms described above, namely, a p-type doped layer, a p-type and n-type doped (compensated) layer, or an npnp or nipin superlattice layer.

Our unique device design is based upon the principles that in response to electrical, thermal or optical excitation; (a) in a substantially undoped active layer, the density of states distribution in the mobility gap changes in an attempt to restore the Fermi level back towards midgap, and (b) in a doped non-crystalline semiconductor material the doping efficiency will change so as to restore the Fermi level back to its original position. Therefore, when the external stress is removed, charge will be transferred from the proximity recovery layer to accelerate the removal of the excess defects in the active layer. The rate of defect annealing increases as the carrier density increases.

In standard thin film transistors which we have fabricated by the known plasma deposition process, the thickness of the charge transport layer 16 is on the order of about 600 Å. In our proximity recovery TFTs, the charge transport layer 40 comprises about 300 Å of intrinsic amorphous silicon and the proximity recovery layer 42 is about 300 Å of lightly doped p-type amorphous silicon or compensated amorphous silicon. Thus, our invention is completely compatible with our standard fabrication process which must only be modified by first simply depositing a lesser amount of intrinsic amorphous silicon material, followed by the additional simultaneous introduction of a boron containing (p-type) gas, or boron and phosphorus containing gases.

In our experimental plasma deposition equipment the amorphous silicon active layer was deposited by introducing silane and hydrogen (the hydrogen carrier gas is discounted) into the reaction chamber. The proximity recovery layer was deposited by introducing diborane (p-type) plus silane and hydrogen, and the p- and n-type proximity recovery layer was deposited by introducing diborane (p-type) and phosphene (n-type) plus silane and hydrogen. The following standard deposition parameters were used: substrate temperature of 200° C. to 275° C.; RF power of about 5 to 10 watts (for a substrate about 2 to 3 inches in diameter); ambient pressure of about 0.3 Torr; and a deposition rate of 0.25 to 1.0 μm per hour.

It is important that the proximity recovery layer be sufficiently lightly doped so that it will not provide a conductive path between the source and the drain or otherwise alter the initial electrical characteristics of these devices. When the recovery layer comprises a lightly doped p-type material, we found that the dopant concentration should be no greater than 20 ppm in the gas phase, preferably in the range of 3 to 10 ppm (with an active layer about 300 Å thick). For this thickness of active layer dopant concentrations of greater than about 20 ppm in the gas phase increase the instability of the device by causing over-recovery, i.e. causing the Fermi level to move to the bottom half of the bandgap rather than to the midgap. We also know, from Oki et al, "Threshold Voltage Control of an A-Si TFT," pp. 186-189, Conference Record of the International Topical Conference on Hydrogenated Amorphous Silicon Devices and Technology, Nov. 21-23, 1988 and Matsumoto et al, "Threshold voltage shift of Amorphous Silicon Thin-Film Transistors by Step Doping," pp. 606-607, Appl. Phys. Lett. 54 (7), Feb. 13, 1989 that doping at concentrations of greater than about 20 ppm in the gas phase, with an active layer about 300 Å thick, also increases the threshold voltage ($V_{TH}$). It is our aim to speed up recovery without affecting the initial characteristics.

When the proximity recovery layer is simultaneously doped with both n-type and p-type materials we refer to it as being "compensated." It should be understood that this term does not have the same meaning in the amorphous semiconductor art as in the crystalline semiconductor art wherein a compensated material includes equal amounts of n-type and p-type dopants. In amorphous silicon applications, wherein dopants are introduced in the gas phase, the amounts of active dopants in the deposited compensated material cannot be determined easily from the gas phase constituents alone. There is a tendency in amorphous silicon to self-compensation so that while the ratio of gas phase dopants may not be 1:1, the resultant amount of active dopants in the layer may be substantially equal. The spectrum of compensation in the proximity recovery layer is broad and may be tailored to satisfy most requirements. It may range from perfect compensation, i.e. including substantially equal amounts of n-type and p-type dopants, to partial compensation, i.e. a ratio which could be about 10:1, with one or the other dopant type being dominant.

We have found that about a three-fold higher concentration of dopants may be used in a compensated proximity recovery layer than that in the solely p-type proximity recovery layer. Therefore, the desired concentration should be no greater than about 100 ppm in the gas phase and, preferably, in the range of 10 to 30 ppm in the gas phase, for an active layer about 300 Å thick. Advantages of the compensated layer are that it is electrically neutral, it accelerates equilibration in active layers operating in electron or hole accumulation, and it corrects for both the $V_X$ and $V_{TH}$ shifts.

In the non-crystalline semiconductor art, the conventional designation for dopant concentration is "ppm dopant in the gas phase." This represents the ratio of the reactant gases introduced into the plasma deposition chamber, i.e. the dopant gas, usually diborane ($B_2H_6$) for p-type and phosphene ($P_2H_3$) for n-type, to silane ($SiH_4$). Empirically it is known that the dopant to silicon ratio in the film is about three times the gas phase ratio. Since intrinsic amorphous silicon includes $5 \times 10^{22}$ silicon atoms per $cm^3$, a dopant concentration of 20 ppm of dopant in the gas phase (upper limit for p-type material) results in about 60 ppm of dopant in the solid phase, or about $3 \times 10^{18}$ dopant atoms per $cm^3$ in the layer. Thus, the preferable dopant concentration range of 3 to 10 ppm in the gas phase, for p-type material, is about $4.5 \times 10^{17}$ to $1.5 \times 10^{18}$ dopant atoms per $cm^3$ in the layer, for an active layer about 300 Å thick. Similarly, 100 ppm, for each dopant of the compensated material, equates to $1.5 \times 10^{19}$ dopant atoms per $cm^3$ and the range 10 to 30 ppm equates to $1.5 \times 10^{18}$ to $4.5 \times 10^{18}$ dopant atoms per $cm^3$ in the layer. These concentration values are based upon an active layer of about 300 Å. As the active layer is made thicker, the dopant concentration in the recovery layer will have to be increased, because the proximity recovery layer will be further from the channel and its effectiveness for accelerating equilibration will be reduced because fewer charge carriers will spill over from the active layer to the channel. Therefore, in such a case, a p-type proximity recovery layer should have a dopant concentration which will provide substantially the same number of carriers of the opposite sign to the channel carriers as would a recovery layer having a concentration less than $3 \times 10^{18}$ atoms per $cm^3$ provide to an active layer having a thickness of 300 Å. For a compensated proximity recovery layer used in conjunction with a thicker active layer, the dopant concentration for each dopant type, should be enough to provide substantially the same number of carriers of the opposite sign to the channel carriers as would a recovery layer having a concentration less than $3 \times 10^{18}$ atoms per $cm^3$, of each dopant type, provide to an active layer having a thickness of 300 Å.

Figure 1:
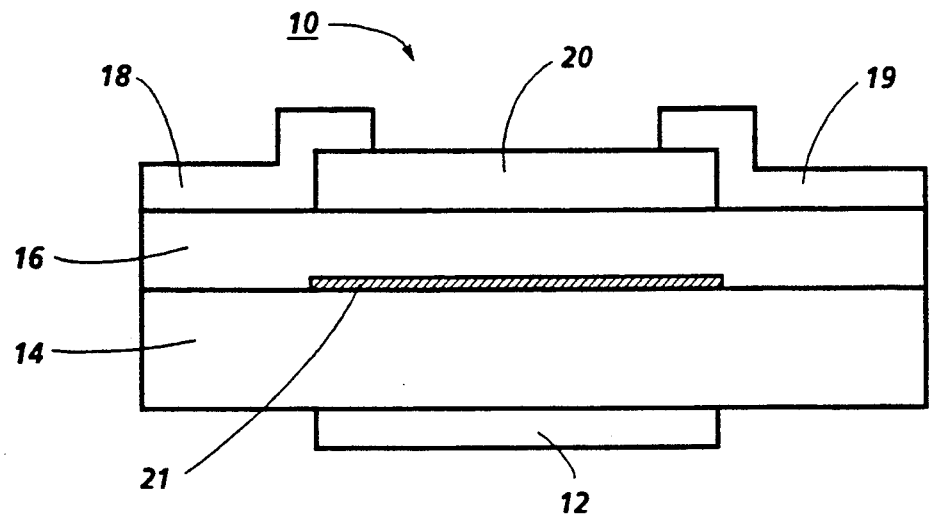
FIG. 1 illustrates a standard a-Si:H standard a-Si:H thin film transistor.
Figure 2:
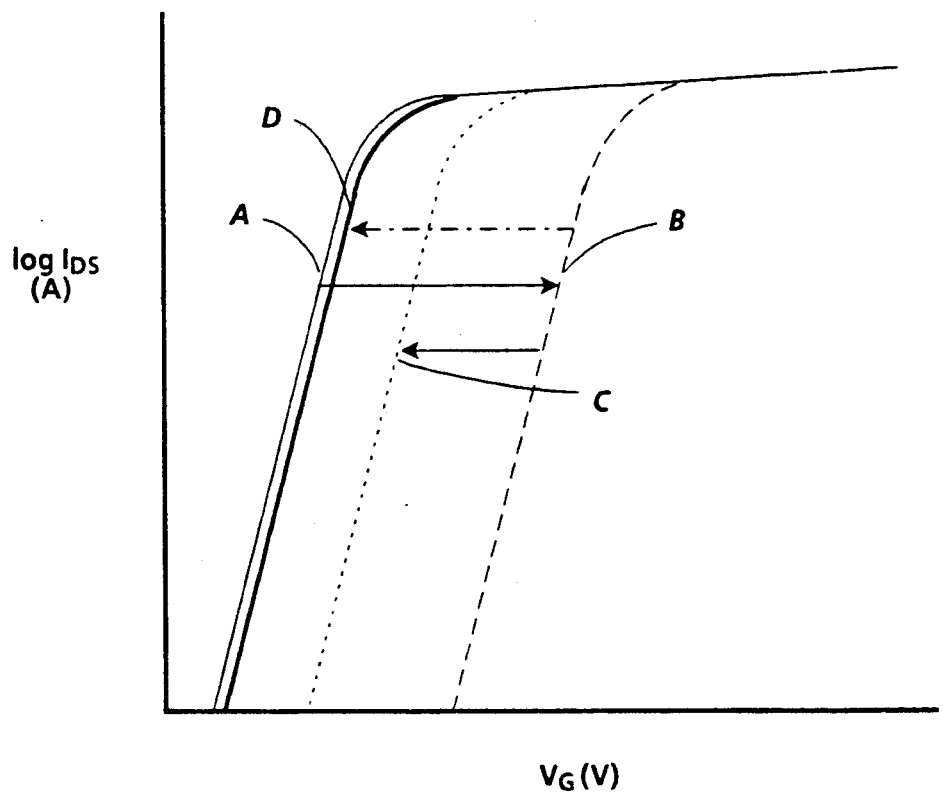
FIG. 2 illustrates output characteristic curves showing threshold voltage ($V_{TH}$) shifting and recovery of the transistor of FIG. 1.

During operation, when a positive gate bias is applied to the standard thin film transistor having a proximity recovery layer, the Fermi level of the channel portion of the charge transport layer is shifted toward the conduction band and defects are formed in the lower half of the bandgap. Simultaneously, the gate field induces electrons in the p-type or compensated proximity recovery layer causing it to become n-type, in response to which it equilibrates by activating more p-type dopant atoms. Upon removal of the gate bias there will be an excess of holes available in this layer, which act to speed up equilibration of the charge transport layer. Curve D in FIG. 2 represents the final state of the threshold voltage shift of a TFT with a proximity recovery layer in place. It can be seen that we have been able to virtually eliminate the threshold voltage ($V_T$) shift.

Figure 4:
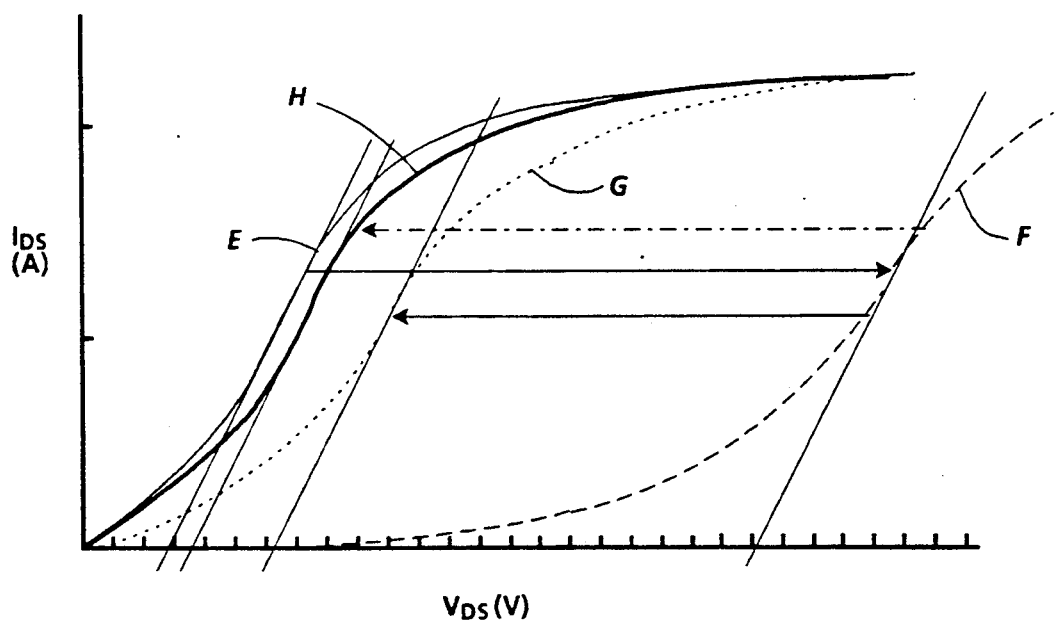
FIG. 4 illustrates output characteristic curves showing the $V_x$ shifting and recovery of the transistor of FIG. 3, FIGS. 5 to 7a illustrate several forms of a non-crystalline semiconductor thin film transistor constructed in accordance with the present invention.

In a similar manner, the proximity recovery layer 64 will accelerate equilibration of the highly stressed "drift" (ungated) region of high voltage thin film transistor 62 when the device is in a REST state. In normal operation, in the OFF state of the device ($V_G$ low, $V_{DS}$ high), the dead region of the charge transport layer 66 will be depleted of electrons by the high drain potential, causing its Fermi level to move toward the lower half of the bandgap. Equilibration will result in the generation of defects in the upper half of the bandgap, which is the cause of the $V_X$ shift. When the device is turned ON ($V_G$ high, $V_{DS}$ applied) the device will self correct and remove the $V_X$ shift. The same external perturbation (deep depletion) will cause the compensated proximity recovery layer to become p-type, to which the layer responds spontaneously by activating more phosphorus dopant atoms therein. When the device is disconnected from its power source, and is in a REST state, after having been in the OFF state, the proximity recovery layer will have an excess of electrons available, which act to speed up equilibration of the charge transport layer. Curve H in FIG. 4 represents the final state of the characteristic curve of a high voltage threshold voltage TFT with a proximity recovery layer in place. It can be seen that we have been able to virtually eliminate the threshold voltage $V_X$ shift.

In the high voltage TFT the $V_X$ shift is prominent and is of much greater concern than the $V_T$ shift which also occurs. The origins of $V_T$ and $V_X$ shifts are in different physical locations within the device. The $V_T$ shift occurs due to defect generation in the channel region directly above the gate electrode while the $V_X$ shift occurs in the drift region $L_2$ adjacent the gate. By using a proximity recovery layer including both p-type and n-type dopants, spontaneous correction takes place for both shift conditions because the external perturbation which causes the shift also superactivates the appropriate dopant for accelerating equilibration and eliminating it. Thus, by depositing a compensated proximity recovery layer over a large area array including both low voltage and high voltage TFTs, the same layer will act to accelerate equilibration of both types of devices.

Another source of device instability arises from the trapping of electric charge within the gate dielectric. If unassisted, the rate at which the gate dielectric self anneals to remove the trapped charges will be quite slow. The proximity recovery layer provided to accelerate the equilibration of the amorphous semiconductor charge transport layer will also serve to supply carriers for more rapidly neutralizing this trapped charge.

The mechanism involved in the equilibration of active amorphous semiconductor devices is based upon movement of the Fermi level within the bandgap and the creation of defects in the material. The defects are dangling bond states, or traps, where electrons can reside and can be either neutral, or positively or negatively charged. This is an undesirable state because when an electron is trapped, it is unable to move through the material. Additionally, an accumulation of charge screens the device from the external bias, thus, requiring a higher external bias to overcome this space charge. The position of the Fermi level, which divides occupied from unoccupied states, determines the charge of a trap. Acceptor-like states in the bandgap below the Fermi level are negatively charged and donor-like states above it are positively charged. We have determined that the juxtaposition of a doped recovery layer to an active layer of an electronic device will allow the exchange of charge between the layers to accelerate the return of the Fermi level of the active layer to midgap, its most thermodynamically stable state. In the absence of the proximity recovery layer, which speeds up equilibration to the order of hours, the active layer will slowly self anneal and return the Fermi level to midgap in a time frame on the order of days, at room temperature.

Our invention, as described above, provides a basis for the designing of active amorphous semiconductor devices having accelerated recovery of both the threshold voltage shift and the $V_X$ shift. This is a generalized, and not an optimized, solution based upon successful experimental results and lends itself to numberous solutions to specific device conditions. We have presented our results in a paper entitled "Proximity Recovery Layers To Speed Up The Recovery Of Stressed Amorphous Silicon Thin Film Transistors," published in Volume 192 of the Materials Research Society Symposium Proceedings, Apr. 17-20, 1990, whose contents are fully incorporated herein by reference. It should be understood that those practicing our invention may have applications which require the modification of the ratio of dopants and dopant concentrations in the proximity recovery layer, and that the above disclosure has been made only by way of example. Numerous other changes in details of construction and the combination and arrangement of elements and materials may be resorted to without departing from the true spirit and scope of the invention as hereinafter claimed.

What is claimed:

1. An electronic device including a substantially intrinsic non-single crystal semiconductor active layer having a charge transport channel therein, within which external stresses on said device cause regions within said charge transport channel to depart from their equilibrium state by changing their distribution of defects, and
   a recovery layer for accelerating the return of said regions to their equilibrium state, said recovery layer comprising a doped non-single crystal semiconductor layer, including both p-type and n-type dopants, positioned in proximity to said active layer.

2. The electronic device as defined in claim 1 wherein said recovery layer wherein each of which dopant types is of a concentration which will provide substantially the same number of carriers to said regions as does a recovery layer having a concentration of each dopant type less than $1.5 \times 10_{19}$ atoms per cm$^3$ for an active layer having a thickness of 300 Å.

3. The electronic device as defined in claim 2 wherein the dopant concentration of each of said dopant types in said recovery layer is capable of providing substantially the same number of carriers to said regions as does a doped layer having a concentration of each dopant type in the range of $1.5 \times 10^{18}$ to $4.5 \times 10^{18}$ atoms per cm$^3$.

4. An electronic device including a substantially intrinsic non-single crystal semiconductor active layer within which a conducting channel is formed, in the ON state of said device, by carriers of one sign being induced therein, and
   a recovery layer for accelerating the equilibration of said channel, said recovery layer comprising a doped non-single crystal semiconductor layer positioned in proximity to said active layer, so as to provide to said channel carriers of a sign opposite to the carriers of said one sign.

5. The electronic device as defined in claim 4 wherein said recovery layer comprises a lightly doped p-type semiconductor material having a dopant concentration which will provide substantially the same number of carriers of said opposite sign to said channel carriers as does a recovery layer having a concentration less than $3 \times 10^{18}$ atoms per cm$^3$ to an active layer having a thickness of 300 Å.

6. The electronic device as defined in claim 5 wherein the dopant concentration in said recovery layer will provide substantially the same number of carriers of said opposite sign to said channel carriers as does a recovery layer having a concentration in the range of $4.5 \times 10^{17}$ to $1.5 \times 10^{18}$ atoms per cm$^3$.

7. The electronic device as defined in claim 4 wherein said recovery layer comprises a semiconductor material including both p-type and n-type dopants.

8. The electronic device as defined in claim 7 wherein the dopant concentration of each of which dopant type is of a concentration which will provide substantially the same number of carriers of said opposite sign to said channel carriers as does a recovery layer having a concentration less than $1.5 \times 10^{19}$ atoms per cm$^3$ for an active layer having a thickness of 300 Å.

9. The electronic device as defined in claim 8 wherein the dopant concentration of each of said dopant types in said recovery layer is capable of providing substantially the same number of carriers of said opposite sign to said channel carriers as does a doped layer of that type having a concentration in the range of $1.5 \times 10^{18}$ to $4.5 \times 10^{18}$ atoms per cm$^3$.

10. An electronic device including a substantially intrinsic non-single crystal semiconductor active layer, having a charge transport channel therein, within which external stresses on said device cause regions within said charge transport channel to depart from their equilibrium state by changing their distribution of defects, and
    recovery means comprising a doped non-single crystal semiconductor layer positioned in proximity to said active layer, so as to provide to said channel regions carriers of a sign necessary to return said regions to their equilibrium state, said recovery means accelerating the rate of equilibration of said active layer as compared to the rate of equilibration of an electronic device of the same configuration without said recovery means.

11. The electronic device as defined in claim 10 wherein said recovery means comprises substantially equal amounts of n-type and p-type dopants.

12. The electronic device as defined in claim 11 wherein the ratio of said dopants to one another is no greater than 10:1.

13. The electronic device as defined in claim 10 wherein said recovery means is in contact with said active layer.

14. The electronic device as defined in claim 10 wherein said recovery means comprises doped amorphous silicon.

15. The electronic device as defined in claim 10 wherein said active layer comprises amorphous silicon.

16. The electronic device as defined in claim 10 wherein said active layer comprises an amorphous material.

17. The electronic device as defined in claim 10 wherein said active layer comprises a microcrystalline material.

18. The electronic device as defined in claim 10 wherein said active layer comprises a polycrystalline material.

19. The electronic device as defined in claim 10 wherein said recovery means comprises a superlattice structure including a plurality of alternating sublayers of n-type and p-type materials.

20. The electronic device as defined in claim 19 wherein said sublayers of n-type and p-type materials are separated by substantially intrinsic amorphous semiconductor layers.

21. The electronic device as defined in claim 10 wherein said device includes laterally spaced source and drain elements, said active layer extends between said source and drain elements, and said recovery means is coextensive with active layer.

22. An electronic device including a substantially intrinsic non-single crystal semiconductor active layer having a number of metastable defects therein, said active layer being responsive to the application of stress upon said device by shifting its Fermi level from an equilibrium state within its mobility gap and the creation of a surplus number of metastable defects in said mobility gap located to oppose the shift in said Fermi level, whereby upon removal of said stress said active layer has an abundance of metastable defects, the improvement comprising a doped non-single crystal semiconductor recovery layer positioned in proximity to said active layer, said recovery layer being responsive to said application of stress upon said device by changing the number of active dopant atoms therein and changing the charge in said recovery layer so that charge may spill over from said recovery layer to said active layer for accelerating the return of said active layer to said equilibrium state.

23. The electronic device as defined in claim 22 wherein said recovery layer comprises a lightly doped p-type semiconductor material having a dopant concentration no greater than $3 \times 10^{18}$ atoms per cm$^3$ for an active layer having a thickness of 300 Å.

24. The electronic device as defined in claim 23 wherein the dopant concentration in said recovery layer is in the range of $4.5 \times 10^{17}$ to $1.5 \times 10^{18}$ atoms per cm$^3$ for an active layer having a thickness of 300 Å.

25. The electronic device as defined in claim 22 wherein said recovery layer comprises a semiconductor material including both p-type and n-type dopants.

26. The electronic device as defined in claim 25 wherein the concentration of each dopant type in said recovery layer is in the range of $1.5 \times 10^{19}$ atoms per cm$^3$ for an active layer having a thickness of 300 Å.

27. The electronic device as defined in claim 25 wherein said recovery layer comprises substantially equal amounts of n-type and p-type dopants.

28. The electronic device as defined in claim 25 wherein the ratio of said dopants to one another is no greater than 10:1.

29. The electronic device as defined in claim 22 wherein said recovery layer comprises doped amorphous silicon.

30. The electronic device as defined in claim 22 wherein said active layer comprises amorphous silicon.

31. The electronic device as defined in claim 25 wherein said recovery layer comprises a superlattice structure including a plurality of alternating sublayers of n-type and p-type materials.

32. The electronic device as defined in claim 31 wherein said sublayers of n-type and p-type materials are separated by substantially intrinsic amorphous semiconductor layers.

33. An electronic device including a substantially intrinsic non-single crystal semiconductor active layer, a gate electrode, a gate dielectric layer and a recovery means for accelerating the equilibration of said active layer and said gate dielectric layer, said recovery means comprising a doped non-single crystal semiconductor layer positioned in proximity to said active layer and said gate dielectric layer.

34. The electronic device as defined in claim 33 wherein said recovery layer comprises a lightly doped p-type semiconductor material having a dopant concentration no greater than $3 \times 10^{18}$ atoms per cm$^3$ for an active layer having a thickness of 300 Å.

35. The electronic device as defined in claim 33 wherein said recovery layer comprises a semiconductor material including both p-type and n-type dopants.

36. The electronic device as defined in claim 35 wherein the concentration of each dopant type in said recovery layer is in the range of $1.5 \times 10^{19}$ atoms per cm$^3$ for an active layer having a thickness of 300 Å.

37. The electronic device as defined in claim 33 wherein said recovery layer comprises a superlattice structure including a plurality of alternating sublayers of n-type and p-type materials.

38. The electronic device as defined in claim 37 wherein said sublayers of n-type and p-type materials are separated by substantially intrinsic amorphous semiconductor layers.

39. An electronic device including a charge transport region, a gate electrode separated from said charge transport region by a gate dielectric, within which external stresses on said device cause charge trapping within regions of said gate dielectric, and a recovery layer for accelerating the neutralization of said charge, said recovery layer comprising a doped non-single crystal semiconductor layer, including both p-type and n-type dopants, positioned in proximity to said active layer.

40. The electronic device as defined in claim 39 wherein said recovery layer wherein each of which dopant types is of a concentration which will provide substantially the same number of carriers to said regions as does a recovery layer having a concentration of each dopant type less than $1.5 \times 10^{19}$ atoms per cm$^3$ for an active layer having a thickness of 300 Å.

41. The electronic device as defined in claim 40 wherein the dopant concentration of each of said dopant types in said recovery layer is capable of providing substantially the same number of carriers to said regions as does a doped layer having a concentration of each dopant type in the range of $1.5 \times 10^{18}$ to $4.5 \times 10^{18}$ atoms per cm$^3$.

42. The electronic device as defined in claim 39 wherein said recovery layer comprises substantially equal amounts of n-type and p-type dopants.

43. The electronic device as defined in claim 42 wherein the ratio of said dopants to one another is no greater than 10:1.

44. The electronic device as defined in claim 39 wherein said recovery layer comprises doped amorphous silicon.

45. The electronic device as defined in claim 39 wherein said recovery layer comprises a superlattice structure including a plurality of alternating sublayers of n-type and p-type materials.

46. The electronic device as defined in claim 45 wherein said sublayers of n-type and p-type materials are separated by substantially intrinsic amorphous semiconductor layers.

47. An electronic device including a charge transport region, a gate electrode separated from said charge transport region by a gate dielectric, within which external stresses on said device cause charge trapping within regions of said gate dielectric, and
  recovery means comprising a doped non-single crystal semiconductor layer positioned in proximity to said active layer, so as to provide to said regions carriers of a sign necessary to return said regions to electrical neutrality.

48. The electronic device as defined in claim 47 wherein said recovery layer comprises a lightly doped p-type semiconductor material having a dopant concentration which will provide substantially the same number of carriers of said opposite sign to said channel carriers as does a recovery layer having a concentration less than $3 \times 10^{18}$ atoms per $cm^3$ to an active layer having a thickness of 300 Å.

49. The electronic device as defined in claim 48 wherein the dopant concentration in said recovery layer will provide substantially the same number of carriers of said opposite sign to said channel carriers as does a recovery layer having a concentration in the range of $4.5 \times 10^{17}$ to $1.5 \times 10^{18}$ atoms per $cm^3$.

50. The electronic device as defined in claim 47 wherein said recovery layer comprises a semiconductor material including both p-type and n-type dopants.

51. The electronic device as defined in claim 50 wherein the dopant concentration of each of which dopant type is of a concentration which will provide substantially the same number of carriers of said opposite sign to said channel carriers as does a recovery layer having a concentration less than $1.5 \times 10^{19}$ atoms per $cm^3$ for an active layer having a thicknes of 300 Å.

52. The electronic device as defined in claim 47 wherein said recovery means comprises a superlattice structure including a plurality of alternating sublayers of n-type and p-type materials.

53. The electronic device as defined in claim 52 wherein said sublayers of n-type and p-type materials are separated by substantially intrinsic amorphous semiconductor layers.

* * * * *